(12) United States Patent
Cho et al.

(10) Patent No.: US 7,411,221 B2
(45) Date of Patent: Aug. 12, 2008

(54) LIGHT EMITTING DEVICE HAVING PROTECTION ELEMENT AND METHOD OF MANUFACTURING THE LIGHT EMITTING DEVICE

(75) Inventors: Jae-hee Cho, Yongin-si (KR); Luo Hong, Troy, NY (US); Jong-kyu Kim, Troy, NY (US); Yong-jo Park, Yongin-si (KR); Cheol-soo Sone, Anyang-si (KR); E. Fred Schubert, Troy, NY (US)

(73) Assignees: Samsung Electro-Mechanics Co., Ltd., Suwon-Si-Gyeonggi-Do (KR); Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 11/271,947

(22) Filed: Nov. 14, 2005

(65) Prior Publication Data
US 2007/0030611 A1   Feb. 8, 2007

Related U.S. Application Data

(60) Provisional application No. 60/704,883, filed on Aug. 3, 2005.

(30) Foreign Application Priority Data
Sep. 26, 2005   (KR) .................. 10-2005-0089474

(51) Int. Cl.
*H01L 27/15* (2006.01)

(52) U.S. Cl. ............................. 257/79; 257/99; 257/93; 257/E33.055

(58) Field of Classification Search .................. 257/79, 257/84, 536, 537, 615; 438/36, 382, 384
See application file for complete search history.

(56) References Cited

U.S. PATENT DOCUMENTS

| | | | | |
|---|---|---|---|---|
| 5,493,148 | A | * | 2/1996 | Ohata et al. .................. 257/538 |
| 6,054,716 | A | * | 4/2000 | Sonobe et al. ............... 250/552 |
| 6,593,597 | B2 | | 7/2003 | Shen |
| 6,709,944 | B1 | * | 3/2004 | Durocher et al. ............ 438/382 |
| 6,943,380 | B2 | * | 9/2005 | Ota et al. ..................... 257/100 |
| 2003/0127706 | A1 | * | 7/2003 | Tanimura ..................... 257/536 |
| 2005/0045907 | A1 | * | 3/2005 | Song et al. ................... 257/103 |
| 2006/0267025 | A1 | * | 11/2006 | Wuu et al. ..................... 257/79 |

FOREIGN PATENT DOCUMENTS

JP   06151958 A   *   5/1994

OTHER PUBLICATIONS

Maxim Application Note # 1804, Masim Integrated Products, Dec. 6, 2002.*

* cited by examiner

*Primary Examiner*—M. Wilczewski
*Assistant Examiner*—Paul E Patton
(74) *Attorney, Agent, or Firm*—Buchanan Ingersoll & Rooney PC

(57) ABSTRACT

A light emitting device having a monolithic protection element and a method of fabricating the light emitting device are provided. The light emitting device includes: a light emitter having a cathode and an anode; and the resistive protection element connected to the light emitter in parallel through the cathode and the anode. Here, a resistance Rs of the resistive protection element has a value between a forward resistance Rf and a reverse resistance Rr of a current of the light emitter.

13 Claims, 6 Drawing Sheets

$I_m >>> I_s$ $I_s >>> I_m$ (a)

(b)

(c)

(d)

(e)

LIGHT EMITTING DEVICE HAVING PROTECTION ELEMENT AND METHOD OF MANUFACTURING THE LIGHT EMITTING DEVICE

CROSS-REFERENCE TO RELATED PATENT APPLICATION

This application claims the benefit of U.S. Provisional Application No. 60/704,883, filed on Aug. 3, 2005, in the U.S. Patent and Trademark Office and Korean Patent Application No. 10-2005-0089474, filed on Sep. 26, 2005, in the Korean Intellectual Property Office, the disclosures of which are incorporated herein in their entirety by reference.

This invention was supported, in whole or in part, with funding under a National Science Foundation grant, grant number ECS 0401075. The United States government has certain rights in this invention.

BACKGROUND OF THE DISCLOSURE

1. Field of the Disclosure

The present disclosure relates to a light emitting device having a monolithic protection element, and more particularly, to a light emitting device having a protection element protecting the light emitting device from static electricity.

2. Description of the Related Art

Light emitting devices such as LDs, LEDs, or the like are highly efficient light sources and are utilized in various fields. However, such a light emitting devices are very brittle with respect to an electric impact such as static electricity. The static electricity discharged in a reverse bias state can damage the internal physical structure of the light emitting device.

An additional protection element is used to protect the light emitting device from such an electrostatic discharge (ESD). The protection element is generally a zener diode connected to the light emitting device in parallel in a reverse polarity. Thus, an electrostatic current applied to the light emitting device in a reverse direction is bypassed through the protection element.

Initially protection elements were manufactured as separate chips and then mounted on a lead frame along with the light emitting devices. The protection elements manufactured as separate chips require wire bonding for an electric connection and thus increase the manufacturing cost.

In a case of a light emitting device using the generally employed flip chip bonding method, a protection element is formed on a substrate to which the light emitting device is bonded. Thus, the light emitting device and the protection element are connected to a conductive bump used for bonding. In this conventional method, the protection element must be formed on the substrate to which the light emitting device is bonded, using a semiconductor thin film process. Thus, manufacturing cost is inevitably increased.

U.S. Patent No. 6,593,597 discloses a structure into which a light emitting device and a protection element are monolithically integrated on a transparent substrate. Since the light emitting device and the protection element are monolithically integrated on the substrate, this structure has significantly more advantages than the previously-described light emitting device. however, the protection element must use a portion of an effective area of the light emitting device. As a result, the area of the light emitting device occupied within a limited area is reduced.

SUMMARY OF THE DISCLOSURE

The present invention may provide a light emitting device having a monolithic protection element so as to be simply manufactured and to minimize a reduction in an occupied area thereof.

According to an aspect of the present invention, there may be provided a light emitting device having a resistive protection element, including: a light emitter having a cathode and an anode; and the resistive protection element connected to the light emitter in parallel through the cathode and the anode. Here, the resistance Rs of the resistive protection element has a value between a forward resistance Rf and a reverse resistance Rr of a current of the light emitter.

According to another aspect of the present invention, there may be provided a light emitting device having a resistive protection element, including: a light emitter comprising a lower semiconductor layer, an upper semiconductor layer, and an active layer formed between the lower and upper semiconductor layers; a first electrode electrically contacting the upper semiconductor layer; a second electrode electrically contacting the lower semiconductor layer; and the resistive protection element contacting the first and second electrodes. Here, a resistance Rs of the resistive protection element has a value between a forward resistance Rf and a reverse resistance Rr of the light emitter.

According to an aspect of the present invention, a first electrode may be formed on an upper surface of a side of the upper semiconductor layer, a portion of a surface of the lower semiconductor layer may be exposed, and a second electrode may be formed on the exposed portion of the lower semiconductor layer. The resistive protection element may be extended from the upper surface of the side of the upper semiconductor layer to a surface of a side of the lower semiconductor layer.

BRIEF DESCRIPTION OF THE DRAWINGS

The above and other features and advantages of the present invention will be described in more detail in exemplary embodiments thereof with reference to the attached drawings in which.

DETAILED DESCRIPTION OF EXEMPLARY EMBODIMENTS

Hereinafter, embodiments of a light emitting device according to the present invention will be described in detail with reference to the attached drawings.

Figure 1:
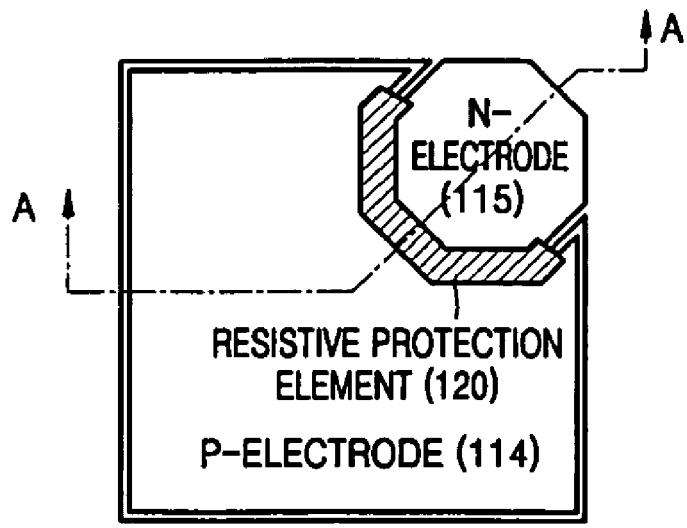
FIG. 1 is a schematic plan view of a light emitting device according to an embodiment of the present invention.
Figure 2:
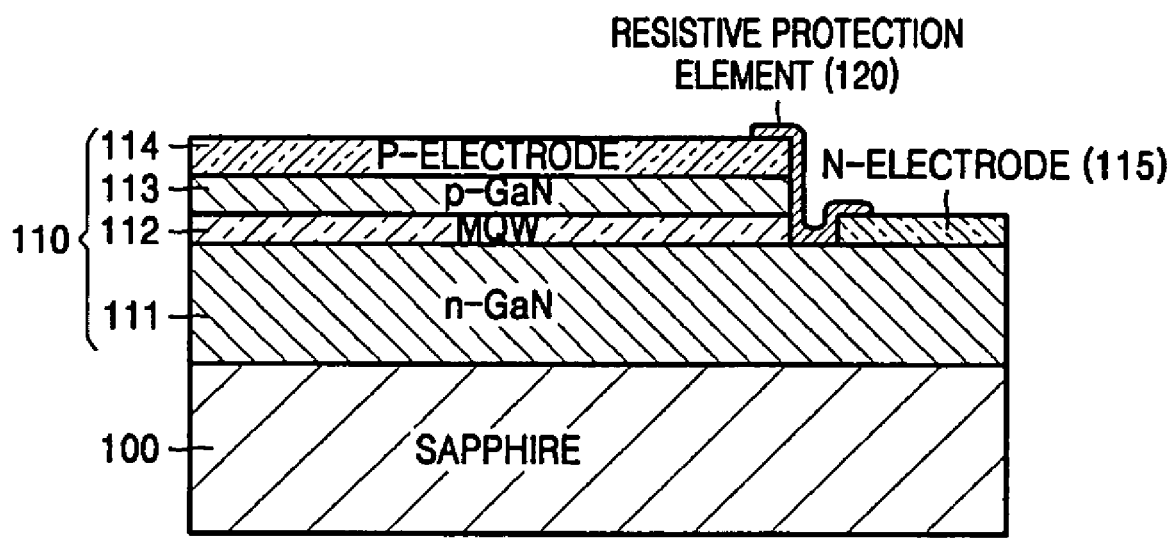
FIG. 2 is a cross-sectional view taken along line A-A shown in FIG. 1.

FIG. 1 is a schematic plan view of a light emitting device having a monolithic resistive protection element according to an embodiment of the present invention, and FIG. 2 is a cross-sectional view taken along line A-A shown in FIG. 1.

Referring to FIGS. 1 and 2, a lower semiconductor layer 111, a multi-quantum well (MQW) 112, and an upper semiconductor layer 113 are formed on a substrate 100, preferably, an insulating substrate such as sapphire or the like.

The stack structure of the lower semiconductor layer 111, the MQW 112, and the upper semiconductor layer 113 is a general LED structure having an anode and a cathode. However, for convenience, only main parts of the stack structure are shown in the drawings. The light emitting device according to the present invention is a GaN LED in which the lower semiconductor layer 111 is an n-GaN layer, and the upper semiconductor layer 113 is a p-GaN layer. A first electrode 114 is formed of a transparent metal on a surface of the p-GaN layer that is the upper semiconductor layer 113, and an active layer 112 including an InGaN-MQW is formed between the upper and lower semiconductor layers 113 and 111.

In the stack structure, a side (shown on the right sides of FIGS. 1 and 2) of the lower semiconductor layer 111 is exposed for an electric contact, and a conductive second electrode 115 is positioned at the side.

According to the present invention, the first and second electrodes 114 and 115 are connected to each other via a resistive protection element 120. The resistive protection element 120 is extended from an upper surface of a side of the stack structure of the active layer 112, the upper semiconductor layer 113, and the first electrode 114 through the side of the stack structure to an upper surface of a side of the second electrode 115. The resistive protection element 120 may be formed of ZnO, ITO, poly-Si, a conductive inorganic material or a conductive organic material using thin film-deposition methods such as e-beam evaporation or sputter deposition.

Figure 3:
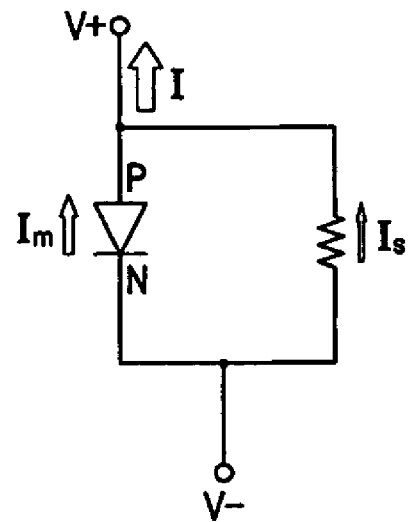
FIG. 3 is an equivalent circuit diagram of the light emitting device shown in FIG. 1 illustrating a flow of a current during the forward applying of a voltage.

The light emitting device of the present invention having the above-described structure is expressed as an equivalent circuit shown in FIG. 3.

The resistive protection element 120 is connected to a light emitter 110 including the active layer 112 and the upper and lower semiconductor layers 113 and 111 in parallel. Thus, predetermined voltages V+ and V− are applied to the light emitter 110, and currents $I_m$ and $I_s$ respectively flow in the light emitter 110 and the resistive protection element 120 connected to the light emitter 110 in parallel. Here, the current $I_s$ flowing in the resistive protection element 120 is much smaller than the current $I_m$ flowing in the light emitter 110. A resistance Rs of the resistive protection element 120 has a value within a range between a forward resistance Rf of a forward current of the light emitter 110 having the P-N junction structure and a reverse resistance Rr (Rr>>Rs>>Rf).

Accordingly, as shown in FIG. 3, a forward voltage is applied to the light emitter 110, and the current $I_m$ flowing in the light emitter 110 is larger than the current $I_s$ flowing in the resistive protection element 120. Here, the intensity of the current $I_m$ flowing in the light emitter 110 must be adjusted to a value corresponding to a desired light intensity of the light emitter 110. A current flowing in the resistive protection element 120 is less than or equal to 1% of the forward current of the light emitter 110. In other words, the resistance Rs of the resistive protection element 120 is designed to be at least 100 times the forward resistance Rf.

Figure 4:
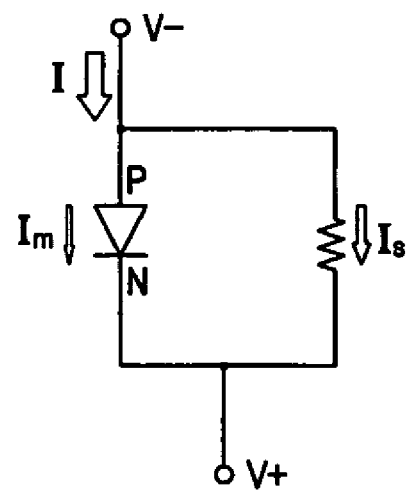
FIG. 4 is an equivalent circuit diagram of the light emitting device shown in FIG. 1 illustrating a flow of a current during a reverse applying of the voltage.

As shown in FIG. 4, a reverse voltage is applied to the light emitter 110 due to external factors, and a relatively large current flows in the resistive protection element 120 sustaining a lower resistance than the light emitter 110. Thus, the light emitter 110 is protected from a reverse voltage applied from an external source.

Figure 5:
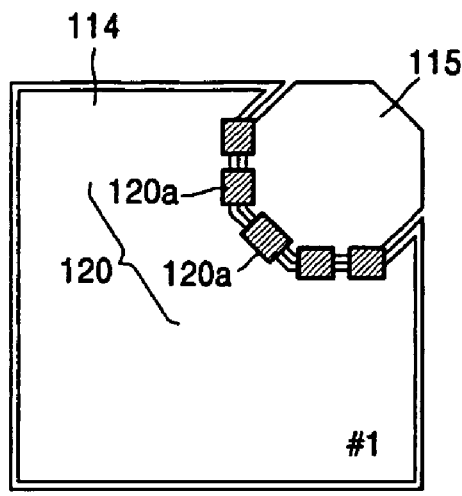
FIG. 5 is a view illustrating representative patterns of protection elements according to embodiments of the present invention.
Figure 5:
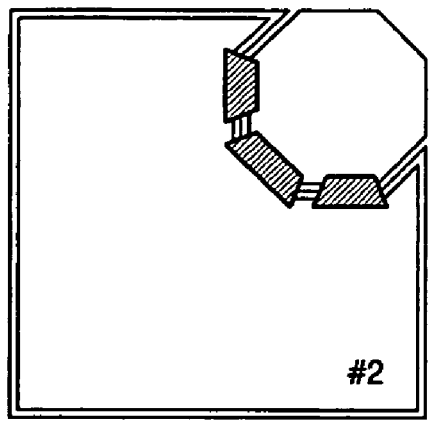
Figure 5:
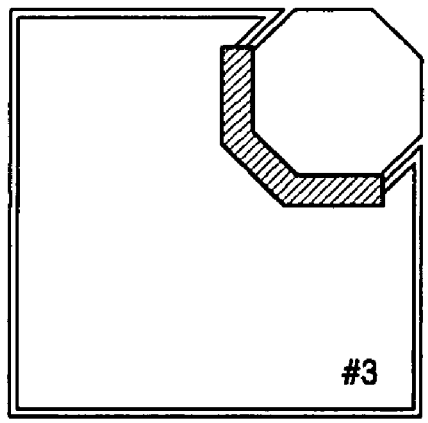
Figure 5:
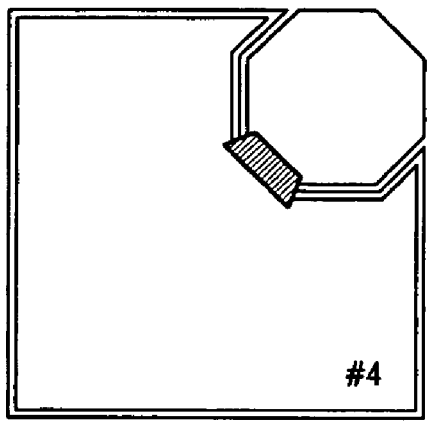
Figure 5:
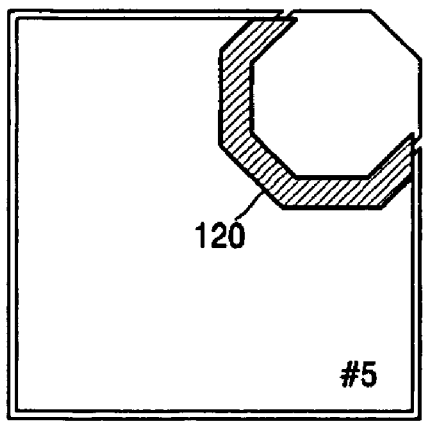

The resistive protection element 120 may be formed of ZnO or may be formed of a thin film as shown in FIG. 1. Alternatively, the resistive protection element 120 may be formed in one of various patterns as shown in FIG. 5. In other words, the resistive protection element 120 may be divided into a plurality of unit elements 120a. The plurality of unit elements 120a constituting the resistive protection element 120 is connected to the light emitter 110 in parallel. The resistive element 120 having one of various patterns shown in FIG. 5 is a representative embodiment and is not intended to limit the scope of the present invention.

Figure 6:
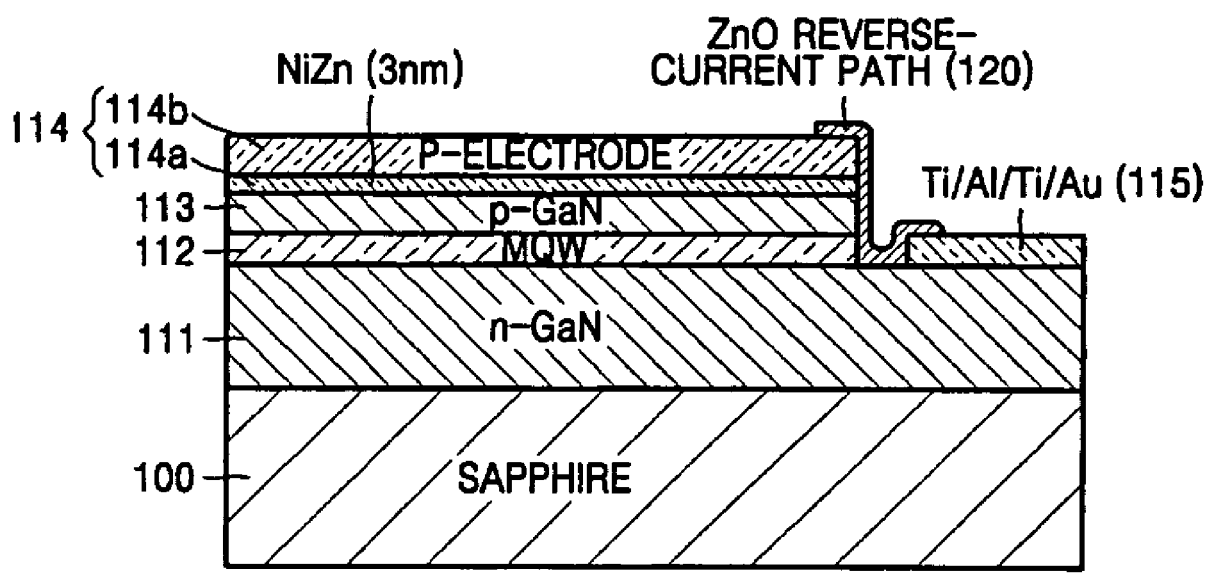
FIG. 6 is a cross-sectional view illustrating components of the light emitting device shown in FIG. 1 in detail.

FIG. 6 is a cross-sectional view illustrating materials constituting layers of the light emitting device. Referring to FIG. 6, an n-GaN layer that is the lower semiconductor layer 111 is formed as a cathode on the substrate 100 formed of an insulating material, i.e., sapphire, and the MQW 112 as the active layer is formed on the n-GaN layer 111. A portion of the lower semiconductor layer 111 is exposed at a side of the MQW 112, and an n-electrode having a stack of Ti, Al, Ti, and Au is formed as the second electrode 115 on the exposed portion of the lower semiconductor layer 111. A p-GaN layer that is the upper semiconductor layer 113 is formed as an anode on the MQW 112, and a p-electrode having a multilayer structure as the first electrode 114 is formed on the p-GaN layer. The p-electrode 114 includes a first layer 114a formed of NiZn to a thickness of about 3 nm and a second layer 114b formed of Ag to a thickness of about 100 nm.

Figure 7:
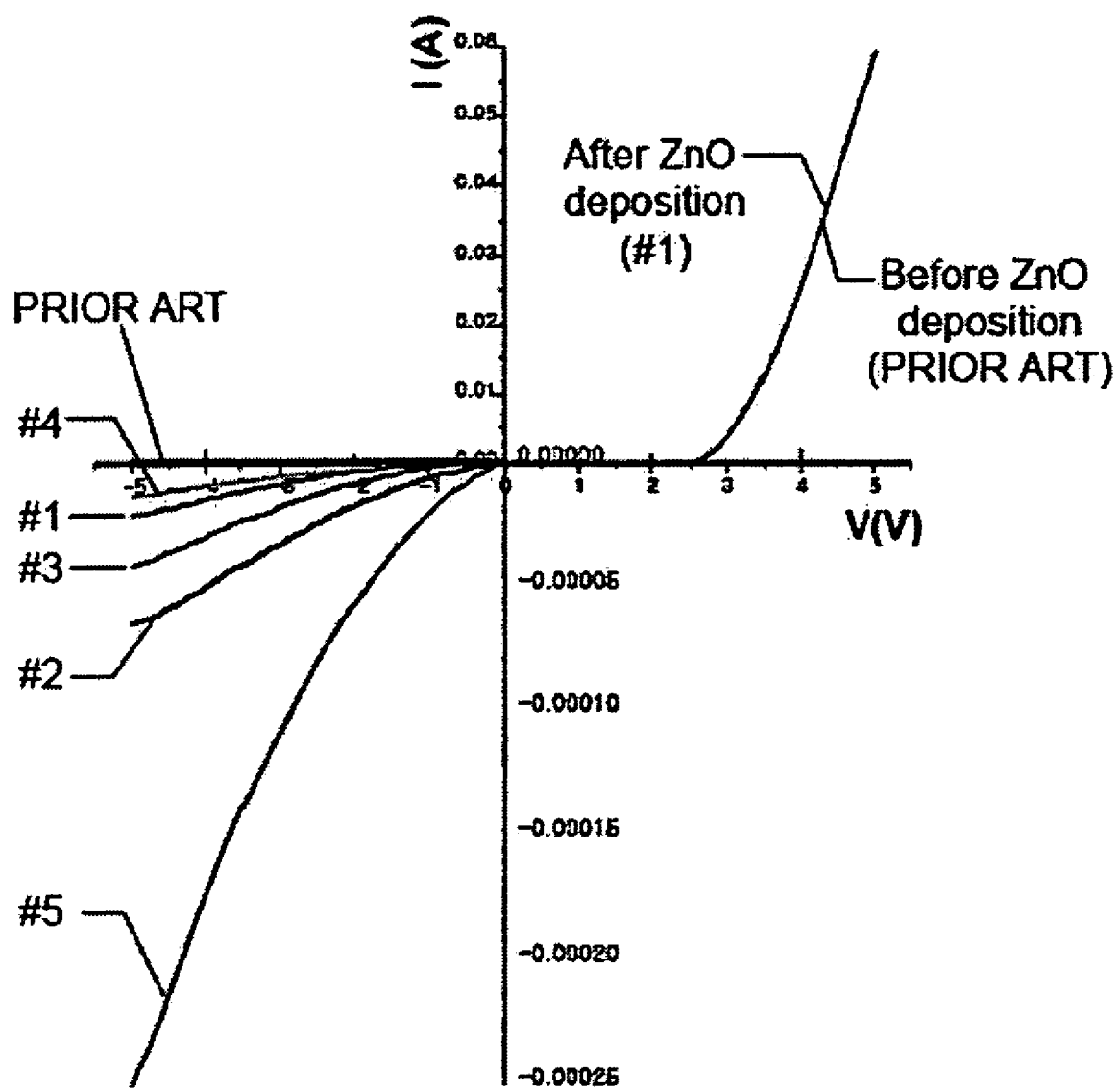
FIG. 7 is a graph illustrating the current (I)-voltage (V) characteristics of a conventional light emitting device and light emitting devices according to the present invention.

FIG. 7 is a graph illustrating I-V characteristics of a conventional light emitting device and light emitting devices of the present invention. Here, #1 through #5 denote the samples shown in FIG. 5, and "prior art" denotes a sample not having a resistive element.

Referring to FIG. 7, in the conventional light emitting device, a current is sharply increased around a forward voltage of +3V. A large current of 50 mA or more flows around a forward voltage of +4V. However, a minute current flows at a reverse voltage of about −5V and there is no numerical change in the graph.

Unlike the conventional light emitting device, the samples #1 through #5 according to the present invention having resistive elements have the same current characteristics when a forward voltage is applied. In other words, there is no large difference in current between the light emitting devices according to the present invention and the conventional light emitting device when a forward voltage is applied. However, when a reverse voltage is applied, a relatively very large current of about −0.07 mA flows in the sample #5 at a reverse voltage of about −5V. A current of about −0.005 mA flows in the sample #4 having a resistive element with the smallest resistance. The current level of about −0.005 mA at a reverse voltage of −5V is a very large current-to-voltage ratio, compared to the conventional light emitting device in which almost no current flows. In addition, the sample #5 has a very high current-to-voltage ratio, which is incomparable with the other samples.

Based on the above-described fact, if the conventional light emitting device is broken at a current of about −0.004 mA, the sample #4 bypasses the current level of about −0.444 mA using its resistive element and thus is not broken. Despite these advantages of the light emitting devices according to the present invention, there is no change in driving voltage between the light emitting devices according to the present invention and the conventional light emitting device. Although the amount of current is slightly increased when a forward voltage of 3V or less, such a level of current that is lost is negligible compared to currently available LEDs. The characteristics of the conventional light emitting device and sample #1 according to the present invention when a forward voltage is applied are illustrated. The characteristics of the other samples when a forward voltage is applied are similar to the characteristics of sample #1.

Figure 8:
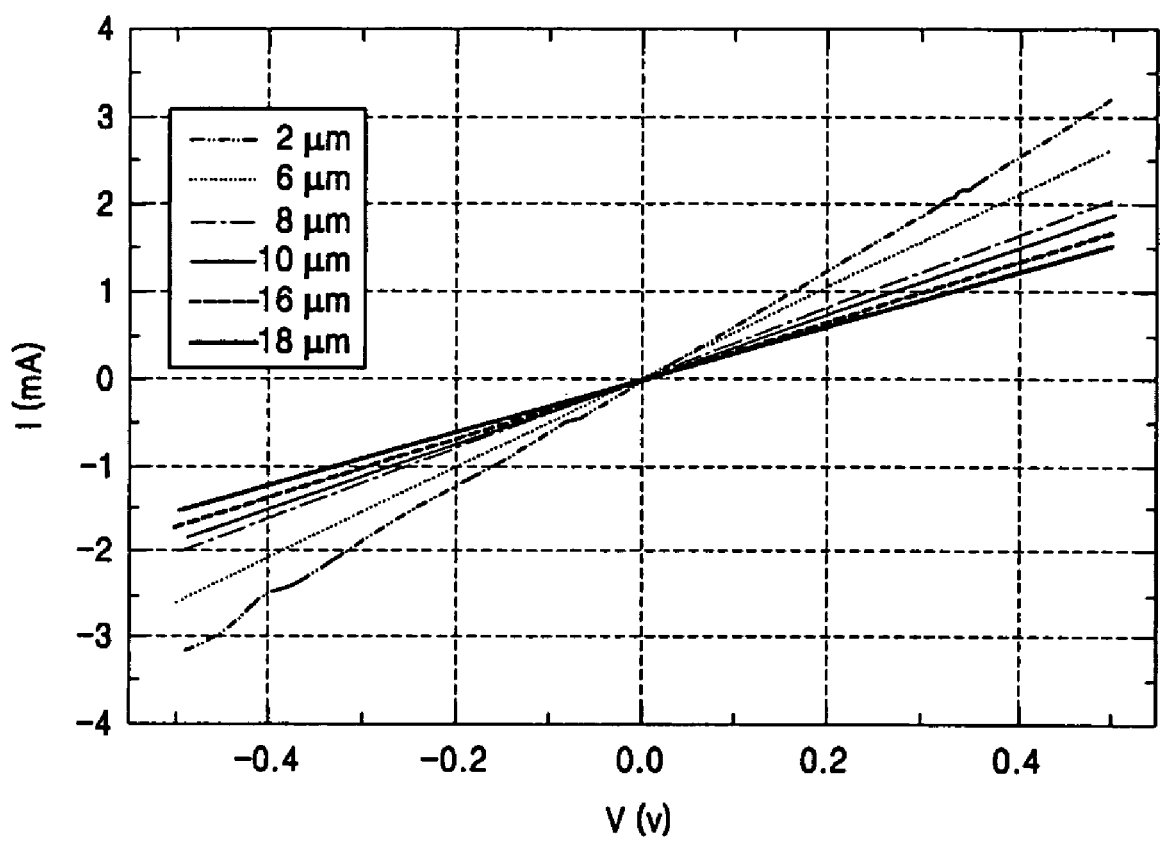
FIG. 8 is a graph illustrating a sheet resistance of a ZnO thin film used as a material for a resistive element.

FIG. 8 is a graph illustrating a sheet resistance of a ZnO thin film used as a material from which a resistive element is formed. The resistive element formed of the ZnO thin film shows a basic characteristic by which a current flows linearly with respect to a voltage. Figures in a table denote distances between pads through which a current flows. As a distance becomes distant, a small current flows. Of the characteristics of the ZnO resistive element according to the present embodiment, a resistivity is $1.65 \times 10^{-2} \Omega\text{-cm}$, a sheet resistance is 2200 $\Omega$/sq (76 nm), and a thickness of the ZnO resistive element can be adjusted to adjust the resistivity.

Summarizing comprehensive data obtained in a process of obtaining the above-described results, a sheet resistance of a resistive protection element has a typical value between approximately 100 $\Omega$/sq and 20000 $\Omega$/sq.

As described above, in a light emitting device having a monolithic protection element and a method of manufacturing the light emitting device according to the present invention, a resistive protection element can be used as the monolithic protection element. The resistive protection element can be installed as an internal current bypass of a small current with respect to a light emitter in parallel. Thus, the light emitter can be protected from an ESD. The resistive protection element can be manufactured on a wafer level in an almost last step of a wafer-level process for manufacturing the light emitting device having the resistive protection element. Thus, protection elements can be mass-produced at a low cost.

An increase in cost caused by an addition of the resistive protection element during the manufacturing of the light emitting device can be minimized. Thus, a light emitting device into which a compact resistive protection element is monolithically integrated can be manufactured at a low cost.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device, comprising:
   a lower semiconductor layer;
   an active layer formed above a first portion of a first surface of the lower semiconductor layer;
   an upper semiconductor layer formed above the active layer;
   a first electrode layer formed above the upper semiconductor layer and to be in electrical connection with the upper semiconductor layer;
   a second electrode layer formed above a second portion of the first surface of the lower semiconductor and in electrical connection with the lower semiconductor layer, wherein a space extending between the first and the second electrode layers; and
   a resistive protection layer formed to fill at least a part of the space between the first and second electrode layers to electrically connect the first and second electrodes,
   wherein a resistance Rf is an electrical resistance of the upper semiconductor layer, the active layer, and the lower semiconductor layer when a positive voltage is applied to the first electrode relative to the second electrode,
   wherein a resistance Rr is the electrical resistance of the upper semiconductor layer, the active layer, and the lower semiconductor layer when a negative voltage is applied to the first electrode relative to the second electrode, and
   wherein a resistance Rs of the resistive protection layer is greater than Rf and less than Rr.

2. The light emitting device of claim 1, wherein the resistance value Rs is substantially fixed.

3. The light emitting device of claim 1, further comprising:
   a substrate layer formed below the lower semiconductor layer.

4. The light emitting device of claim 1, wherein the first electrode layer comprises a transparent metal.

5. The light emitting device of claim 1, wherein the first electrode layer comprises:
   a NiZn layer formed above the upper semiconductor layer and to be in electrical connection with the upper semiconductor layer; and
   a Ag layer formed above the NiZn layer and in electrical connection with the NiZn layer.

6. The light emitting device of claim 1, wherein the second electrode layer comprises a stack of Ti, Al, Ti and Au materials.

7. The light emitting device of claim 1, wherein the resistive protection layer comprises at least one of ZnO, ITO, poly-Si, and a conductive inorganic or organic material.

8. The light emitting device of claim 1, wherein the resistive protection layer is formed to contact at least a part of a top surface of the first electrode and to contact at least a part of a top surface of the second electrode.

9. The light emitting device of claim 1,
   wherein the lower semiconductor layer comprises n-GaN material, and
   wherein the upper semiconductor layer comprises p-GaN material.

10. The light emitting device of claim 1, wherein the resistance Rs is substantially at least 100 times as high as Rf.

11. The light emitting device of claim 1, wherein the resistive protection layer is formed from a thin film with a sheet resistance that range substantially between 100 $\Omega$/sq and 20000 $\Omega$/sq.

12. The light emitting device of claim 1,
   wherein the resistive protection layer comprises a plurality of resistive protection layer units, and
   wherein each resistive protection layer unit is electrically connected with the first and second electrodes such that all resistive protection layer units are electrically parallel with each other.

13. The light emitting device of claim 1, wherein Rr>>Rs>>Rf.

* * * * *